(12) United States Patent
Shim et al.

(10) Patent No.: US 8,021,924 B2
(45) Date of Patent: *Sep. 20, 2011

(54) ENCAPSULANT CAVITY INTEGRATED CIRCUIT PACKAGE SYSTEM AND METHOD OF FABRICATION THEREOF

(75) Inventors: Il Kwon Shim, Singapore (SG); Byung Joon Han, Singapore (SG); Kambhampati Ramakrishna, Chandler, AZ (US); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/892,907

(22) Filed: Sep. 28, 2010

(65) Prior Publication Data

US 2011/0018084 A1    Jan. 27, 2011

Related U.S. Application Data

(63) Continuation of application No. 12/057,299, filed on Mar. 27, 2008, now Pat. No. 7,855,100, which is a continuation of application No. 11/306,628, filed on Jan. 4, 2006, now Pat. No. 7,364,945.

(60) Provisional application No. 60/667,277, filed on Mar. 31, 2005.

(51) Int. Cl.
*H01L 21/00* (2006.01)
*H01L 23/02* (2006.01)

(52) U.S. Cl. ........ 438/109; 438/125; 438/127; 257/686; 257/782; 257/E21.499; 257/E21.502; 257/E21.505; 257/E23.003; 257/E23.02

(58) Field of Classification Search ........................ None
See application file for complete search history.

(56) References Cited

U.S. PATENT DOCUMENTS

| | | | |
|---|---|---|---|
| 4,524,121 A | 6/1985 | Gleim et al. |
| 4,697,203 A | 9/1987 | Sakai et al. |
| 4,764,804 A | 8/1988 | Sahara et al. |
| 4,894,707 A | 1/1990 | Yamawaki et al. |
| 5,186,383 A | 2/1993 | Melton et al. |
| 5,214,307 A | 5/1993 | Davis |
| 5,214,308 A | 5/1993 | Nishiguchi et al. |
| 5,222,014 A | 6/1993 | Lin |
| 5,229,960 A | 7/1993 | De Givry |
| 5,269,453 A | 12/1993 | Melton et al. |
| 5,340,771 A | 8/1994 | Rostoker |
| 5,373,189 A | 12/1994 | Massit et al. |

(Continued)

FOREIGN PATENT DOCUMENTS

EP    0 430 458 A2    6/1991

(Continued)

OTHER PUBLICATIONS

Kim, J. and Boruch, J., "Enabling a Microelectronic WorldTM", AMKOR Technology, Inc. 2002 Annual Report, retrieved from Internet:<URL:http://media.corporate-ir.net/media_files/iro/11/115640/2002AnnualReport.pdf.

(Continued)

*Primary Examiner* — Alonzo Chambliss
(74) *Attorney, Agent, or Firm* — Mikio Ishimaru (57) ABSTRACT

A method for fabricating an encapsulant cavity integrated circuit package system includes: forming a first integrated circuit package with an inverted bottom terminal having an encapsulant cavity and an interposer, and attaching a component on the interposer in the encapsulant cavity.

12 Claims, 7 Drawing Sheets

U.S. PATENT DOCUMENTS

| | | |
|---|---|---|
| 5,436,203 A | 7/1995 | Lin |
| 5,444,296 A | 8/1995 | Kaul et al. |
| 5,495,398 A | 2/1996 | Takiar et al. |
| 5,550,711 A | 8/1996 | Burns et al. |
| 5,579,207 A | 11/1996 | Hayden et al. |
| 5,607,227 A | 3/1997 | Yasumoto et al. |
| 5,650,667 A | 7/1997 | Liou |
| 5,652,185 A | 7/1997 | Lee |
| 5,734,199 A | 3/1998 | Kawakita et al. |
| 5,744,863 A | 4/1998 | Culnane et al. |
| 5,748,452 A | 5/1998 | Londa |
| 5,760,478 A | 6/1998 | Bozso et al. |
| 5,811,351 A | 9/1998 | Kawakita et al. |
| 5,824,569 A | 10/1998 | Brooks et al. |
| 5,828,128 A | 10/1998 | Higashiguchi et al. |
| 5,844,315 A | 12/1998 | Melton et al. |
| 5,854,507 A | 12/1998 | Miremadi et al. |
| 5,874,781 A | 2/1999 | Fogal et al. |
| 5,898,219 A | 4/1999 | Barrow |
| 5,899,705 A | 5/1999 | Akram |
| 5,903,049 A | 5/1999 | Mori |
| 5,963,430 A | 10/1999 | Londa |
| 5,973,337 A | 10/1999 | Knapp et al. |
| 5,977,640 A | 11/1999 | Bertin et al. |
| 5,977,641 A | 11/1999 | Takahashi et al. |
| 5,982,633 A | 11/1999 | Jeansonne |
| 5,994,166 A | 11/1999 | Akram et al. |
| 6,025,648 A | 2/2000 | Takahashi et al. |
| RE36,613 E | 3/2000 | Ball |
| 6,034,875 A | 3/2000 | Heim et al. |
| 6,075,289 A | 6/2000 | Distefano |
| 6,083,775 A | 7/2000 | Huang et al. |
| 6,083,811 A | 7/2000 | Riding et al. |
| 6,101,100 A | 8/2000 | Londa |
| 6,107,164 A | 8/2000 | Ohuchi |
| 6,118,176 A | 9/2000 | Tao et al. |
| 6,121,682 A | 9/2000 | Kim |
| 6,130,448 A | 10/2000 | Bauer et al. |
| 6,133,626 A | 10/2000 | Hawke et al. |
| 6,143,588 A | 11/2000 | Glenn |
| 6,144,507 A | 11/2000 | Hashimoto |
| 6,157,080 A | 12/2000 | Tamaki et al. |
| 6,165,815 A | 12/2000 | Ball |
| 6,201,266 B1 | 3/2001 | Ohuchi et al. |
| 6,201,302 B1 | 3/2001 | Tzu |
| 6,204,562 B1 | 3/2001 | Ho et al. |
| 6,225,699 B1 | 5/2001 | Ference et al. |
| 6,238,949 B1 | 5/2001 | Nguyen et al. |
| 6,242,932 B1 | 6/2001 | Hembree |
| 6,246,123 B1 | 6/2001 | Landers, Jr. et al. |
| 6,265,766 B1 | 7/2001 | Moden |
| 6,266,197 B1 | 7/2001 | Glenn et al. |
| 6,274,930 B1 | 8/2001 | Vaiyapuri et al. |
| 6,291,263 B1 | 9/2001 | Huang |
| 6,291,884 B1 | 9/2001 | Glenn et al. |
| 6,294,406 B1 | 9/2001 | Bertin et al. |
| 6,297,131 B1 | 10/2001 | Yamada et al. |
| 6,316,735 B1 | 11/2001 | Higashiguchi |
| 6,316,838 B1 | 11/2001 | Ozawa et al. |
| 6,333,552 B1 | 12/2001 | Kakimoto et al. |
| 6,340,846 B1 | 1/2002 | LoBianco et al. |
| 6,353,257 B1 | 3/2002 | Huang |
| 6,358,773 B1 | 3/2002 | Lin et al. |
| 6,369,454 B1 | 4/2002 | Chung |
| 6,372,551 B1 | 4/2002 | Huang |
| 6,376,904 B1 | 4/2002 | Haba et al. |
| 6,379,988 B1 | 4/2002 | Peterson et al. |
| 6,384,472 B1 | 5/2002 | Huang |
| 6,388,313 B1 | 5/2002 | Lee et al. |
| 6,396,116 B1 | 5/2002 | Kelly et al. |
| 6,400,007 B1 | 6/2002 | Wu et al. |
| 6,407,381 B1 | 6/2002 | Glenn et al. |
| 6,407,456 B1 | 6/2002 | Ball |
| 6,410,861 B1 | 6/2002 | Huang et al. |
| 6,413,798 B2 | 7/2002 | Asada |
| 6,414,381 B1 | 7/2002 | Takeda |
| 6,420,204 B2 | 7/2002 | Glenn |
| 6,420,244 B2 | 7/2002 | Lee |
| 6,424,050 B1 | 7/2002 | Komiyama |
| 6,441,496 B1 | 8/2002 | Chen et al. |
| 6,445,064 B1 | 9/2002 | Ishii et al. |
| 6,455,353 B2 | 9/2002 | Lin |
| 6,462,421 B1 | 10/2002 | Hsu et al. |
| 6,472,732 B2 | 10/2002 | Terui |
| 6,489,676 B2 | 12/2002 | Taniguchi et al. |
| 6,492,726 B1 | 12/2002 | Quek et al. |
| 6,501,165 B1 | 12/2002 | Farnworth et al. |
| 6,503,780 B1 | 1/2003 | Glenn et al. |
| 6,509,639 B1 | 1/2003 | Lin |
| 6,512,219 B1 | 1/2003 | Webster et al. |
| 6,512,303 B2 | 1/2003 | Moden |
| 6,529,027 B1 | 3/2003 | Akram et al. |
| 6,534,419 B1 | 3/2003 | Ong |
| 6,538,319 B2 | 3/2003 | Terui |
| 6,541,857 B2 | 4/2003 | Caletka et al. |
| 6,545,365 B2 | 4/2003 | Kondo et al. |
| 6,545,366 B2 | 4/2003 | Michii et al. |
| 6,552,423 B2 | 4/2003 | Song et al. |
| 6,555,902 B2 | 4/2003 | Lo et al. |
| 6,555,917 B1 | 4/2003 | Heo |
| 6,566,745 B1 | 5/2003 | Beyne et al. |
| 6,570,249 B1 | 5/2003 | Liao et al. |
| 6,571,466 B1 | 6/2003 | Glenn et al. |
| 6,580,169 B2 | 6/2003 | Sakuyama et al. |
| 6,583,503 B2 | 6/2003 | Akram et al. |
| 6,590,281 B2 | 7/2003 | Wu et al. |
| 6,593,647 B2 | 7/2003 | Ichikawa |
| 6,593,648 B2 | 7/2003 | Emoto |
| 6,593,662 B1 | 7/2003 | Pu et al. |
| 6,599,779 B2 | 7/2003 | Shim et al. |
| 6,607,937 B1 | 8/2003 | Corisis |
| 6,610,563 B1 | 8/2003 | Waitl et al. |
| 6,611,063 B1 | 8/2003 | Ichinose et al. |
| 6,613,980 B1 | 9/2003 | McGhee et al. |
| 6,617,198 B2 | 9/2003 | Brooks |
| 6,621,169 B2 | 9/2003 | Kikuma et al. |
| 6,621,172 B2 | 9/2003 | Nakayama et al. |
| 6,627,864 B1 | 9/2003 | Glenn et al. |
| 6,627,979 B2 | 9/2003 | Park |
| 6,642,609 B1 | 11/2003 | Minamio et al. |
| 6,649,445 B1 | 11/2003 | Qi et al. |
| 6,649,448 B2 | 11/2003 | Tomihara |
| 6,650,019 B2 | 11/2003 | Glenn et al. |
| 6,667,556 B2 | 12/2003 | Moden |
| 6,674,156 B1 | 1/2004 | Bayan et al. |
| 6,690,089 B2 | 2/2004 | Uchida |
| 6,692,993 B2 | 2/2004 | Li et al. |
| 6,693,364 B2 | 2/2004 | Tao et al. |
| 6,700,178 B2 | 3/2004 | Chen et al. |
| 6,700,192 B2 | 3/2004 | Matsuzawa et al. |
| 6,706,557 B2 | 3/2004 | Koopmans |
| 6,707,140 B1 | 3/2004 | Nguyen et al. |
| 6,713,366 B2 | 3/2004 | Mong et al. |
| 6,716,670 B1 | 4/2004 | Chiang |
| 6,734,539 B2 | 5/2004 | Degani et al. |
| 6,734,552 B2 | 5/2004 | Combs et al. |
| 6,734,569 B2 | 5/2004 | Appelt et al. |
| 6,737,750 B1 | 5/2004 | Hoffman et al. |
| 6,740,980 B2 | 5/2004 | Hirose |
| 6,746,894 B2 | 6/2004 | Fee et al. |
| 6,747,361 B2 | 6/2004 | Ichinose |
| 6,762,488 B2 | 7/2004 | Maeda et al. |
| 6,774,475 B2 | 8/2004 | Blackshear et al. |
| 6,777,799 B2 | 8/2004 | Kikuma et al. |
| 6,777,819 B2 | 8/2004 | Huang |
| 6,784,534 B1 | 8/2004 | Glenn et al. |
| 6,787,915 B2 | 9/2004 | Uchida et al. |
| 6,787,916 B2 | 9/2004 | Halahan |
| 6,791,036 B1 | 9/2004 | Chen et al. |
| 6,791,076 B2 | 9/2004 | Webster |
| 6,794,741 B1 | 9/2004 | Lin et al. |
| 6,794,749 B2 | 9/2004 | Akram |
| 6,809,405 B2 | 10/2004 | Ito et al. |
| 6,818,980 B1 | 11/2004 | Pedron, Jr. |
| 6,828,665 B2 | 12/2004 | Pu et al. |
| 6,833,612 B2 | 12/2004 | Kinsman |
| 6,835,598 B2 | 12/2004 | Baek et al. |

| | | |
|---|---|---|
| 6,838,761 B2 | 1/2005 | Karnezos |
| 6,847,105 B2 | 1/2005 | Koopmans |
| 6,851,598 B2 | 2/2005 | Gebauer et al. |
| 6,852,570 B2 | 2/2005 | Hasegawa |
| 6,861,288 B2 | 3/2005 | Shim et al. |
| 6,861,683 B2 | 3/2005 | Rissing et al. |
| 6,864,566 B2 | 3/2005 | Choi |
| 6,881,611 B1 | 4/2005 | Fukasawa et al. |
| 6,882,057 B2 | 4/2005 | Hsu |
| 6,890,798 B2 | 5/2005 | McMahon |
| 6,891,239 B2 | 5/2005 | Anderson et al. |
| 6,900,079 B2 | 5/2005 | Kinsman et al. |
| 6,900,528 B2 | 5/2005 | Mess et al. |
| 6,900,549 B2 | 5/2005 | Brooks |
| 6,906,415 B2 | 6/2005 | Jiang et al. |
| 6,906,416 B2 | 6/2005 | Karnezos |
| 6,916,683 B2 | 7/2005 | Stephenson et al. |
| 6,930,378 B1 | 8/2005 | St. Amand et al. |
| 6,930,396 B2 | 8/2005 | Kurita et al. |
| 6,933,598 B2 | 8/2005 | Karnezos |
| 6,951,982 B2 | 10/2005 | Chye et al. |
| 6,972,481 B2 | 12/2005 | Karnezos |
| 7,034,387 B2 | 4/2006 | Karnezos |
| 7,034,388 B2 | 4/2006 | Yang et al. |
| 7,045,887 B2 | 5/2006 | Karnezos |
| 7,049,691 B2 | 5/2006 | Karnezos |
| 7,053,476 B2 | 5/2006 | Karnezos |
| 7,053,477 B2 | 5/2006 | Karnezos et al. |
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,081,678 B2 | 7/2006 | Liu |
| 7,084,500 B2 | 8/2006 | Swnson et al. |
| 7,090,482 B2 | 8/2006 | Tsukahara et al. |
| 7,093,358 B2 | 8/2006 | Akram et al. |
| 7,101,731 B2 | 9/2006 | Karnezos |
| 7,109,574 B2 | 9/2006 | Chiu et al. |
| 7,115,990 B2 | 10/2006 | Kinsman |
| 7,119,427 B2 | 10/2006 | Kim |
| 7,122,906 B2 | 10/2006 | Doan |
| 7,176,506 B2 | 2/2007 | Beroz et al. |
| 7,183,191 B2 | 2/2007 | Kinsman et al. |
| 7,190,061 B2 | 3/2007 | Lee |
| 7,218,005 B2 | 5/2007 | Tago |
| 7,221,059 B2 | 5/2007 | Farnworth et al. |
| 7,298,045 B2 | 11/2007 | Fujitani et al. |
| 7,335,994 B2 | 2/2008 | Klein et al. |
| 7,354,800 B2 | 4/2008 | Carson |
| 7,355,274 B2 | 4/2008 | Lim |
| 7,364,945 B2 | 4/2008 | Shim et al. |
| 7,372,141 B2 | 5/2008 | Karnezos et al. |
| 7,391,105 B2 * | 6/2008 | Yeom ..................... 257/686 |
| 7,391,153 B2 | 6/2008 | Suehiro et al. |
| 7,456,035 B2 | 11/2008 | Eliashevich et al. |
| 7,456,088 B2 | 11/2008 | Park et al. |
| 7,456,495 B2 | 11/2008 | Pohl et al. |
| 7,723,146 B2 | 5/2010 | Chow et al. |
| 7,723,159 B2 | 5/2010 | Do et al. |
| 7,768,125 B2 | 8/2010 | Chow et al. |
| 2002/0024124 A1 | 2/2002 | Hashimoto |
| 2002/0096755 A1 | 7/2002 | Fukui et al. |
| 2002/0100955 A1 | 8/2002 | Potter et al. |
| 2002/0130404 A1 | 9/2002 | Ushijima et al. |
| 2003/0008510 A1 | 1/2003 | Grigg et al. |
| 2003/0113952 A1 | 6/2003 | Sambasivam et al. |
| 2003/0153134 A1 | 8/2003 | Kawata et al. |
| 2004/0016939 A1 | 1/2004 | Akiba et al. |
| 2004/0058472 A1 | 3/2004 | Shim |
| 2004/0061213 A1 | 4/2004 | Karnezos |
| 2004/0124540 A1 | 7/2004 | Chen et al. |
| 2004/0166605 A1 | 8/2004 | Kuratomi et al. |
| 2004/0178499 A1 | 9/2004 | Mistry et al. |
| 2004/0212096 A1 | 10/2004 | Wang |
| 2005/0023657 A1* | 2/2005 | Tsai et al. .................. 257/678 |
| 2005/0051882 A1 | 3/2005 | Kwon et al. |
| 2005/0075053 A1 | 4/2005 | Jung |
| 2006/0043556 A1 | 3/2006 | Su et al. |
| 2006/0065958 A1 | 3/2006 | Tsao et al. |
| 2006/0073635 A1 | 4/2006 | Su et al. |
| 2006/0138631 A1 | 6/2006 | Tao et al. |
| 2006/0189033 A1 | 8/2006 | Kim |
| 2006/0197209 A1 | 9/2006 | Choi et al. |
| 2007/0114648 A1 | 5/2007 | Karnezos |
| 2007/0141751 A1 | 6/2007 | Mistry et al. |
| 2007/0148822 A1 | 6/2007 | Haba et al. |
| 2007/0181895 A1 | 8/2007 | Nagai |

FOREIGN PATENT DOCUMENTS

| | | |
|---|---|---|
| EP | 0 652 630 A2 | 5/1995 |
| JP | 05152505 A | 6/1993 |
| JP | 2000-228468 | 8/2000 |
| JP | 2001-223326 A | 8/2001 |
| JP | 2002261232 | 9/2002 |
| JP | 2003-086733 | 3/2003 |
| JP | 2004297071 A | 10/2004 |
| JP | 2005539403 A | 12/2005 |
| KR | 2001068614 A | 7/2001 |
| KR | 2004085348 A | 10/2004 |
| WO | 98/50954 A1 | 11/1998 |
| WO | 02/084716 A3 | 10/2002 |
| WO | 03/032370 A3 | 4/2003 |
| WO | 2004034433 A2 | 4/2004 |

OTHER PUBLICATIONS

First Office Action for JP Application No. 2008-504377 dated Jun. 28, 2011.

First Office Action for JP Application No. 2008-504521 dated May 10, 2011.

* cited by examiner

ENCAPSULANT CAVITY INTEGRATED CIRCUIT PACKAGE SYSTEM AND METHOD OF FABRICATION THEREOF

CROSS-REFERENCE TO RELATED APPLICATION(S)

This application is a continuation of co-pending U.S. patent application Ser. No. 12/057,299 filed Mar. 27, 2008, which is a continuation of U.S. patent application Ser. No. 11/306,628, filed Jan. 4, 2006, now U.S. Pat. No. 7,364,945 B2, which claims the benefit of U.S. Provisional Patent Application Ser. No. 60/667,277 filed Mar. 31, 2005, and the subject matter thereof is hereby incorporated herein by reference thereto.

TECHNICAL FIELD

The present invention relates generally to integrated circuit package systems, and more particularly to a system for an encapsulant cavity integrated circuit package system.

BACKGROUND ART

Integrated circuits are used in many portable electronic products, such as cell phones, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects what is typically the maximum dimension of the package, namely, the x-y dimension of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, sufficient overlap for electrical interconnect and large footprint top packages have plagued previous stacked package or package on package designs.

Thus a need still remains for an integrated circuit package system to provide reduced area and volume. In view of the increasing demand for density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method for fabricating an encapsulant cavity integrated circuit package system including: forming a first integrated circuit package with an inverted bottom terminal having an encapsulant cavity and an interposer, and attaching a component on the interposer in the encapsulant cavity.

The present invention provides an encapsulant cavity integrated circuit package system, including: a first integrated circuit package with an inverted bottom terminal having an encapsulant cavity and an interposer; and a component on the interposer in the encapsulant cavity.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. The same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
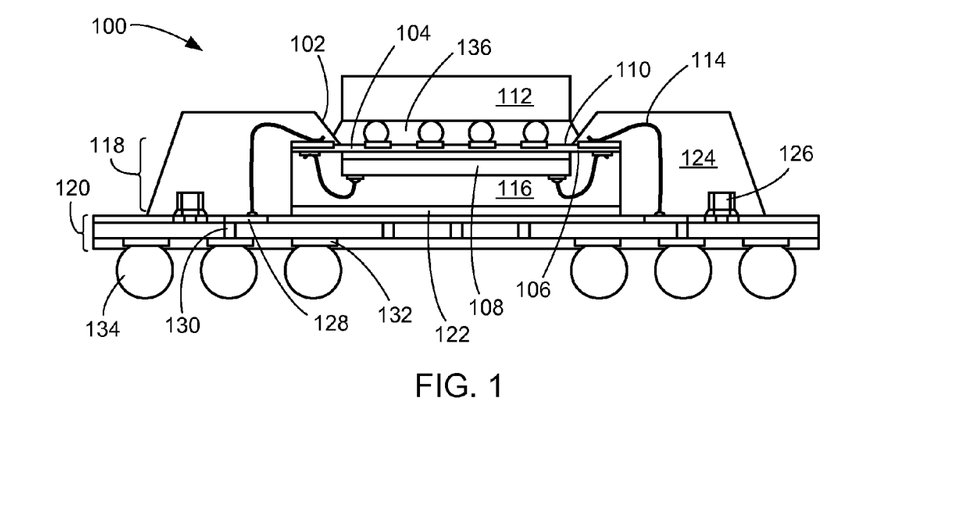
FIG. 1 is a cross-sectional view of an encapsulant cavity integrated circuit package system in an embodiment of the present invention.

Referring now to FIG. 1, therein is shown a cross-sectional view of an encapsulant cavity integrated circuit package system 100 in an embodiment of the present invention. The encapsulant cavity integrated circuit package system 100 includes an encapsulant cavity 102 with an interposer 104, such as an LGA interposer. A first surface 106 of the interposer 104 is attached to a first integrated circuit 108 and a second surface 110 of the interposer 104 provides a surface for mounting a component such as a second integrated circuit package 112 as well as second electrical interconnects 114. The encapsulant cavity 102 with the interposer 104 provides an area efficient mounting region for the second integrated circuit package 112. The second integrated circuit package 112 may be tested prior to attachment providing increased yield and improved costs for the encapsulant cavity integrated circuit package system 100.

The first integrated circuit 108 mounts and electrically connects to the first surface 106 of the interposer 104. After mounting and electrical connection, the first integrated circuit 108 is encapsulated with a first encapsulant 116 to form a first integrated circuit package 118. The first integrated circuit package 118 is attached to a substrate 120 using a die-attach bond 122, such as a thermally conductive adhesive or a film adhesive. A second encapsulant 124 is formed over the substrate 120 that may have passive devices 126 and the second electrical interconnects 114 between the second surface 110 of the interposer 104 and the substrate 120. The substrate 120 includes contact pads 128, vias 130, and interconnect pads 132. Terminal interconnects 134, such as solder balls, are mounted to the interconnect pads 132.

The second encapsulant 124 protects the passive devices 126, the second interconnects 114 and the substrate 120. Further, the second encapsulant 124 is formed with the encapsulant cavity 102 having the second surface 110 of the interposer 104 substantially exposed for attaching the second integrated circuit package 112. An underfill 136 may be applied under the second integrated circuit package 112 and to the encapsulant cavity 102 and the second surface 110 of the interposer 104. The underfill 136 may provide protection and structural integrity to the interposer 104 and the second integrated circuit package 112.

The first integrated circuit package 118 with an inverted bottom terminal, such as an LGA, Bottom Lead Package or QFN, provides an attachment surface on the interposer 104. The interposer 104 enables many types of the first integrated circuit package 118, many functions of the second integrated circuit package 112 and mounting the second integrated circuit package 112 within planar dimensions of the first integrated circuit package 118. It has been discovered that the first integrated circuit package 118 with the inverted bottom terminal allows the use of a smaller footprint for the second integrated circuit package 112 improving size and cost of the encapsulant cavity integrated circuit package system 100.

Figure 2:
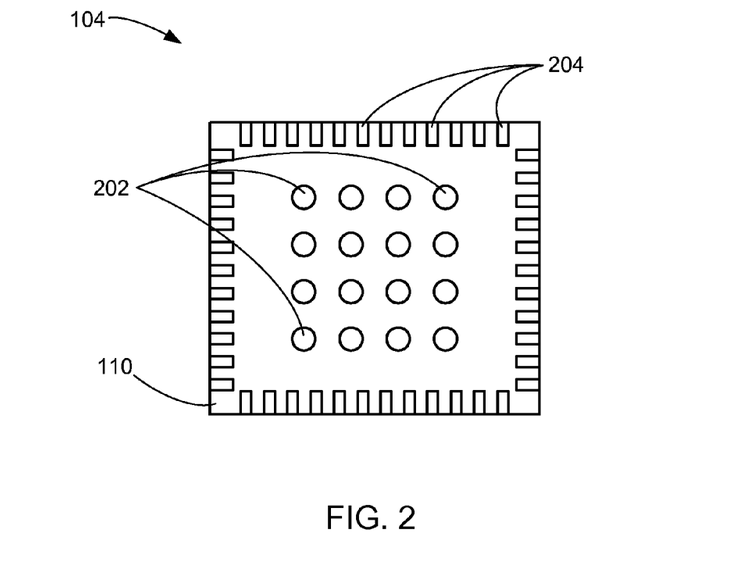
FIG. 2 is a plan view of the second surface of the interposer of the encapsulant cavity integrated circuit package system.

Referring now to FIG. 2, therein is shown a plan view of the second surface 110 of the interposer 104 of the encapsulant cavity integrated circuit package system 100. The second surface 110 of the interposer 104 includes terminal pads 202 and bond fingers 204. The terminal pads 202 provide electrical and mechanical mounting surfaces for the second integrated circuit package 112. The bond fingers 204 of the interposer 104 and the substrate 120 are electrically connected with the second electrical interconnects 114. The terminal pads 202 are electrically connected to the bond fingers 204 by electrical traces (not shown) completing an electrical connection between the second integrated circuit package 112, the first integrated circuit 108 and the substrate 120.

Figure 3:
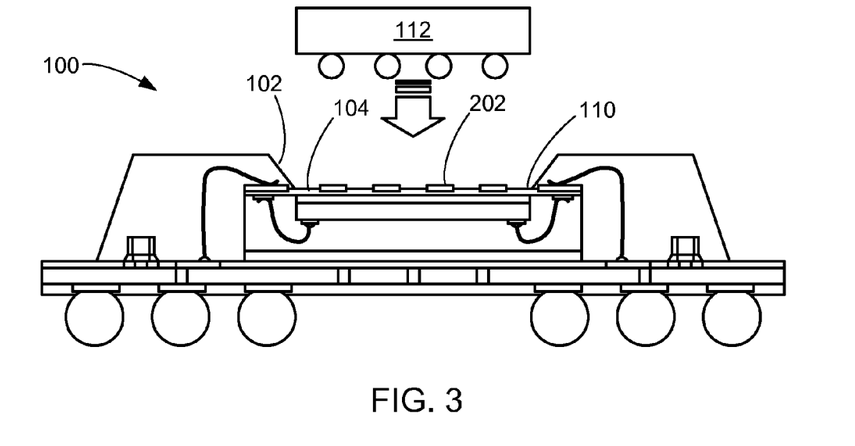
FIG. 3 is a cross-sectional view of the encapsulant cavity integrated circuit package system in a second package-mounting phase.

Referring now to FIG. 3, therein is shown a cross-sectional view of the encapsulant cavity integrated circuit package system 100 in a second package-mounting phase. The encapsulant cavity integrated circuit package system 100 includes the encapsulant cavity 102 and the second surface 110 of the interposer 104 substantially exposed. The second surface 110 of the interposer 104 includes the terminal pads 202 for mounting the second integrated circuit package 112. The second integrated circuit package 112 may be tested to ensure having a known good die (KGD) prior to attachment, such as surface mount, to the second surface 110 of the interposer 104. The second integrated circuit package 112 may be an area array package or a direct chip attach, surface mounted to the second surface 110 of the interposer 104.

Figure 4:
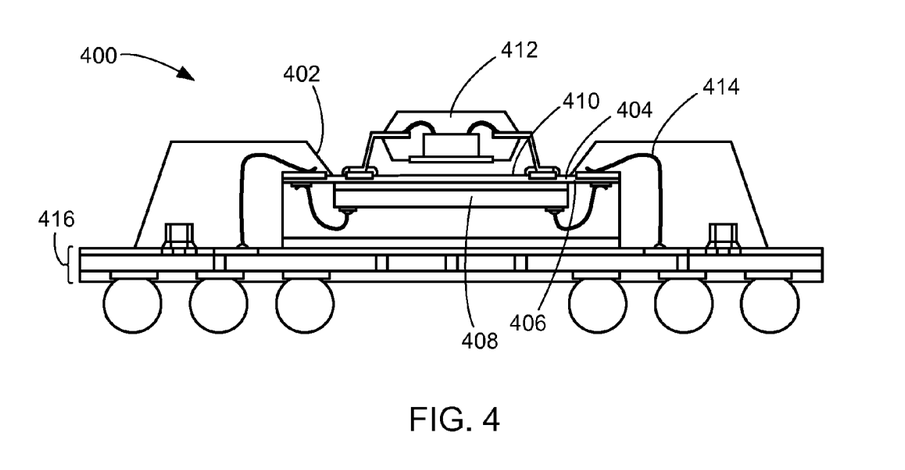
FIG. 4 is a cross-sectional view of an encapsulant cavity integrated circuit package system in an alternative embodiment of the present invention.

Referring now to FIG. 4, therein is shown a cross-sectional view of an encapsulant cavity integrated circuit package system 400 in an alternative embodiment of the present invention. In a manner similar to the encapsulant cavity integrated circuit package system 100 of FIG. 1, the encapsulant cavity integrated circuit package system 400 provides an encapsulant cavity 402 with an interposer 404, such as an LGA interposer. Similarly, a first surface 406 of the interposer 404 is attached to a first integrated circuit 408 and a second surface 410 of the interposer 404 provides a surface for mounting a component such as a leaded package 412 as well as second electrical interconnects 414. The first integrated circuit 408 is mounted to a substrate 416. The leaded package 412 may be surface mounted to the second surface 410 of the interposer 404.

Figure 5:
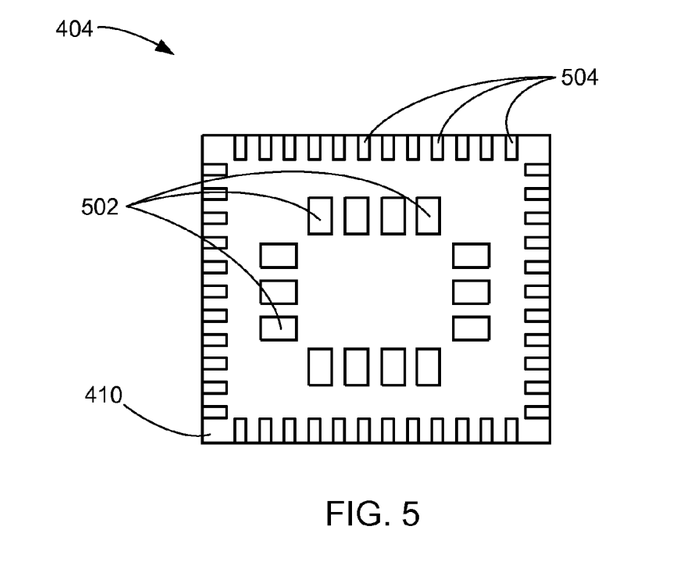
FIG. 5 is a plan view of the second surface of the interposer of the encapsulant cavity integrated circuit package system.

Referring now to FIG. 5, therein is shown a plan view of the second surface 410 of the interposer 404 of the encapsulant cavity integrated circuit package system 400. The second surface 410 of the interposer 404 includes terminal pads 502 and bond fingers 504. The terminal pads 502 provide electrical mounting surfaces, such as surface mount, for the second integrated circuit package 412 of FIG. 4 (not shown). The bond fingers 504 of the interposer 404 of FIG. 4 (not shown) and the substrate 416 of FIG. 4 (not shown) are electrically connected with the second electrical interconnects 414 of FIG. 4 (not shown). The terminal pads 502 are electrically connected to the bond fingers 504 by electrical traces (not shown) completing an electrical connection between the second integrated circuit package 412, the first integrated circuit 408 of FIG. 4 (not shown) and the substrate 416.

Figure 6:
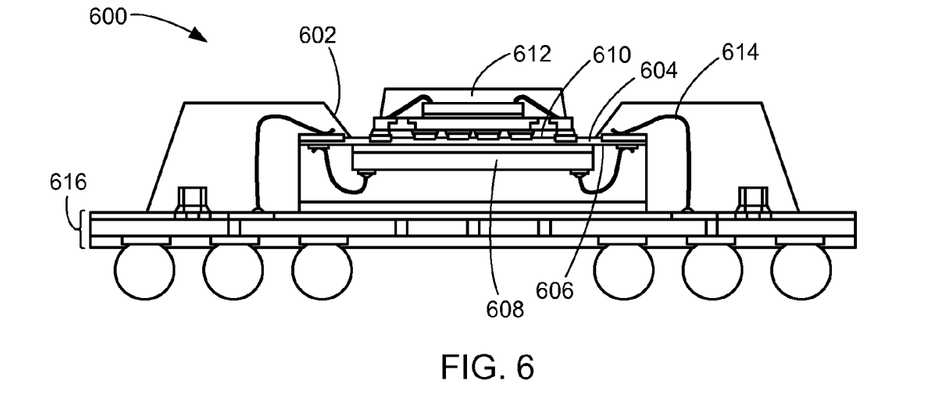
FIG. 6 is a cross-sectional view of an encapsulant cavity integrated circuit package system in another alternative embodiment of the present invention.

Referring now to FIG. 6, therein is shown a cross-sectional view of an encapsulant cavity integrated circuit package system 600 in another alternative embodiment of the present invention. In a manner similar to the encapsulant cavity integrated circuit package system 100 of FIG. 1, the encapsulant cavity integrated circuit package system 600 provides an encapsulant cavity 602 with an interposer 604, such as an LGA interposer. Similarly, a first surface 606 of the interposer 604 is attached to a first integrated circuit 608 and a second surface 610 of the interposer 604 provides a surface for mounting a component such as a leadless package 612 as well as second electrical interconnects 614. The first integrated circuit 608 is mounted to a substrate 616. The leadless package 612 may be surface mounted to the second surface 610 of the interposer 604.

Figure 7:
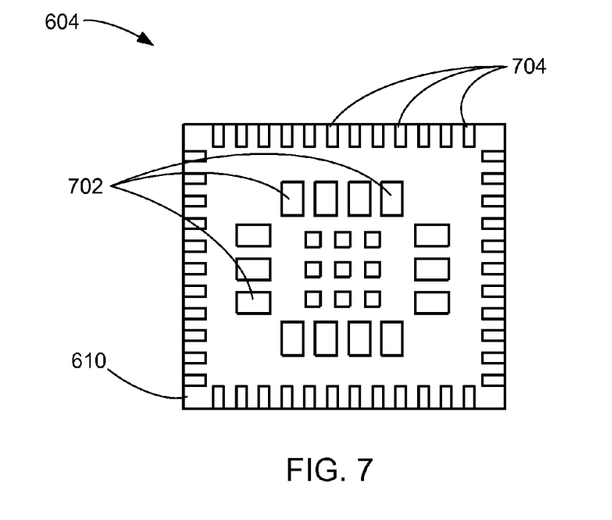
FIG. 7 is a plan view of the second surface of the interposer of the encapsulant cavity integrated circuit package system.

Referring now to FIG. 7, therein is shown a plan view of the second surface 610 of the interposer 604 of the encapsulant cavity integrated circuit package system 600. The second surface 610 of the interposer 604 includes terminal pads 702 and bond fingers 704. The terminal pads 702 provide electrical mounting surfaces, such as surface mount, for the second integrated circuit package 612 of FIG. 6 (not shown). The bond fingers 704 of the interposer 604 of FIG. 6 (not shown) and the substrate 616 of FIG. 6 (not shown) are electrically connected with the second electrical interconnects 614 of FIG. 6 (not shown). The terminal pads 702 are electrically connected to the bond fingers 704 by electrical traces (not shown) completing an electrical connection between the second integrated circuit package 612 of FIG. 6 (not shown) and the substrate 616.

Figure 8:
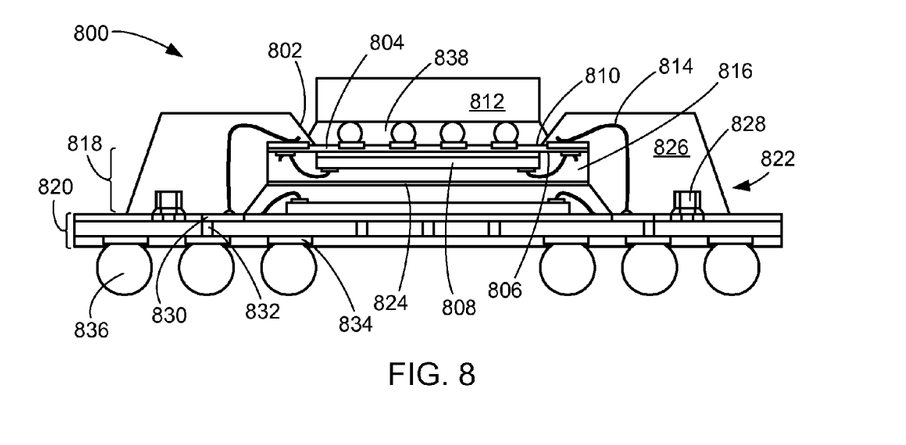
FIG. 8 is a cross-sectional view of an encapsulant cavity integrated circuit package system in yet another alternative embodiment of the present invention.

Referring now to FIG. 8, therein is shown a cross-sectional view of an encapsulant cavity integrated circuit package system 800 in yet another alternative embodiment of the present invention. The encapsulant cavity integrated circuit package system 800 includes an encapsulant cavity 802 with an interposer 804, such as an LGA interposer. A first surface 806 of the interposer 804 is attached to a first integrated circuit 808 and a second surface 810 of the interposer 804 provides a surface for mounting a component such as a second integrated circuit package 812 as well as second electrical interconnects 814.

The first integrated circuit 808 mounts and electrically connects to the first surface 806 of the interposer 804. After mounting and electrical connection, the first integrated circuit 808 is encapsulated with a first encapsulant 816 to form a first integrated circuit package 818. A substrate 820 includes a third integrated circuit package 822. The first integrated circuit package 818 is attached on the third integrated circuit package 822 using a die-attach bond 824, such as a thermally conductive adhesive or a film adhesive.

A second encapsulant 826 is formed over the substrate 820 that may include passive devices 828 and the second electrical interconnects 814 between the second surface 810 of the interposer 804 and the substrate 820. The substrate 820 includes contact pads 830, vias 832, and interconnect pads 834. Terminal interconnects 836, such as solder balls, are mounted to the interconnect pads 834.

The second encapsulant 826 protects the passive devices 828, the second interconnects 814 and the substrate 820. Further, the second encapsulant 826 is formed with the encapsulant cavity 802 having the second surface 810 of the interposer 804 substantially exposed for attaching the second integrated circuit package 812. An underfill 838 may be applied under the second integrated circuit package 812 and to the encapsulant cavity 802 and the second surface 810 of the interposer 804. The underfill 838 may provide protection and structural integrity to the interposer 804 and the second integrated circuit package 812.

Figure 9:
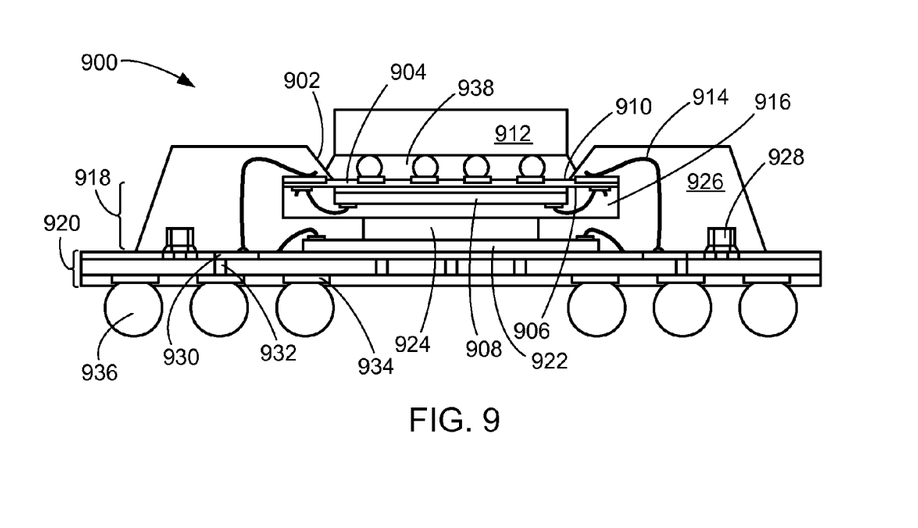
FIG. 9 is a cross-sectional view of an encapsulant cavity integrated circuit package system in yet another alternative embodiment of the present invention.

Referring now to FIG. 9, therein is shown a cross-sectional view of an encapsulant cavity integrated circuit package system 900 in yet another alternative embodiment of the present invention. The encapsulant cavity integrated circuit package system 900 includes an encapsulant cavity 902 with an interposer 904, such as an LGA interposer. A first surface 906 of the interposer 904 is attached to a first integrated circuit 908 and a second surface 910 of the interposer 904 provides a surface for mounting a component such as a second integrated circuit package 912 as well as second electrical interconnects 914.

The first integrated circuit 908 mounts and electrically connects to the first surface 906 of the interposer 904. After mounting and electrical connection, the first integrated circuit 908 is encapsulated with a first encapsulant 916 to form a first integrated circuit package 918. A substrate 920 includes a third integrated circuit 922. The first integrated circuit package 918 is attached to a spacer 924 on the third integrated circuit 922.

A second encapsulant 926 is formed over the substrate 920 that may include passive devices 928 and the second electrical interconnects 914 between the second surface 910 of the interposer 904 and the substrate 920. The substrate 920 includes contact pads 930, vias 932, and interconnect pads 934. Terminal interconnects 936, such as solder balls, are mounted to the interconnect pads 934.

The second encapsulant 926 protects the passive devices 928, the second interconnects 914 and the substrate 920. Further, the second encapsulant 926 is formed with the encapsulant cavity 902 having the second surface 910 of the interposer 904 substantially exposed for attaching the second integrated circuit package 912. An underfill 938 may be applied under the second integrated circuit package 912 and to the encapsulant cavity 902 and the second surface 910 of the interposer 904. The underfill 938 may provide protection and structural integrity to the interposer 904 and the second integrated circuit package 912.

Figure 10:
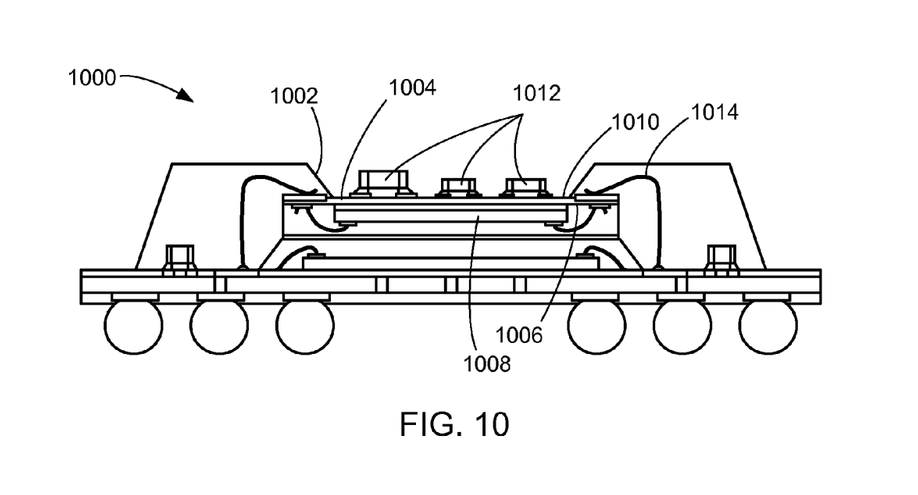
FIG. 10 is a cross-sectional view of an encapsulant cavity integrated circuit package system in yet another alternative embodiment of the present invention.

Referring now to FIG. 10, therein is shown a cross-sectional view of an encapsulant cavity integrated circuit package system 1000 in yet another alternative embodiment of the present invention. In a manner similar to the encapsulant cavity integrated circuit package system 900 of FIG. 9, the encapsulant cavity integrated circuit package system 1000 provides an encapsulant cavity 1002 with an interposer 1004, such as an LGA interposer. Similarly, a first surface 1006 of the interposer 1004 is attached to a first integrated circuit 1008 and a second surface 1010 of the interposer 1004 provides a surface for mounting components such as passive devices 1012 as well as second electrical interconnects 1014. The passive devices 1012 may be surface mounted to the second surface 1010 of the interposer 104.

Figure 11:
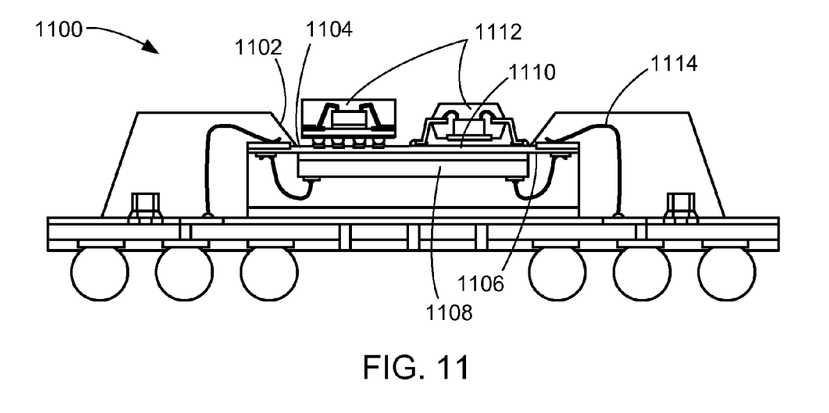
FIG. 11 is a cross-sectional view of an encapsulant cavity integrated circuit package system in yet another alternative embodiment of the present invention.

Referring now to FIG. 11, therein is shown a cross-sectional view of an encapsulant cavity integrated circuit package system 1100 in yet another alternative embodiment of the present invention. In a manner similar to the encapsulant cavity integrated circuit package system 100 of FIG. 1, the encapsulant cavity integrated circuit package system 1100 provides an encapsulant cavity 1102 with an interposer 1104, such as an LGA interposer. Similarly, a first surface 1106 of the interposer 1104 is attached to a first integrated circuit 1108 and a second surface 1110 of the interposer 1104 provides a surface for mounting components such as system device packages 1112 as well as second electrical interconnects 1114. The system device packages 1112 may include surface-mount package technology, such as area array packages, leaded packages, or direct chip attach. Further, the system device packages 1112 may include passive device integration and surface mount to the second surface 1110 of the interposer 1104.

Figure 12:
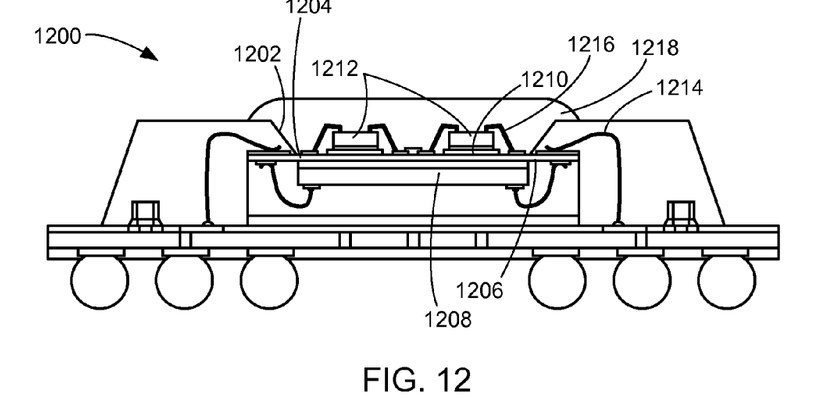
FIG. 12 is a cross-sectional view of an encapsulant cavity integrated circuit package system in yet another alternative embodiment of the present invention.

Referring now to FIG. 12, therein is shown a cross-sectional view of an encapsulant cavity integrated circuit package system 1200 in yet another alternative embodiment of the present invention. In a manner similar to the encapsulant cavity integrated circuit package system 100 of FIG. 1, the encapsulant cavity integrated circuit package system 1200 provides an encapsulant cavity 1202 with an interposer 1204, such as an LGA interposer. Similarly, a first surface 1206 of the interposer 1204 is attached to a first integrated circuit 1208 and a second surface 1210 of the interposer 1204 provides a surface for mounting components such as system devices 1212 as well as second electrical interconnects 1214. The system devices 1212 may include chip-scale package technology, such as chip on board, flip chip, or direct chip attach. Further, the system devices 1212 may include passive devices and surface mount to the second surface 1210 of the interposer 1204. Third electrical interconnects 1216 may connect the system devices 1212 to the second surface 1210 of the interposer 1204. A third encapsulant 1218 may be applied over the system devices 1212.

Figure 13:
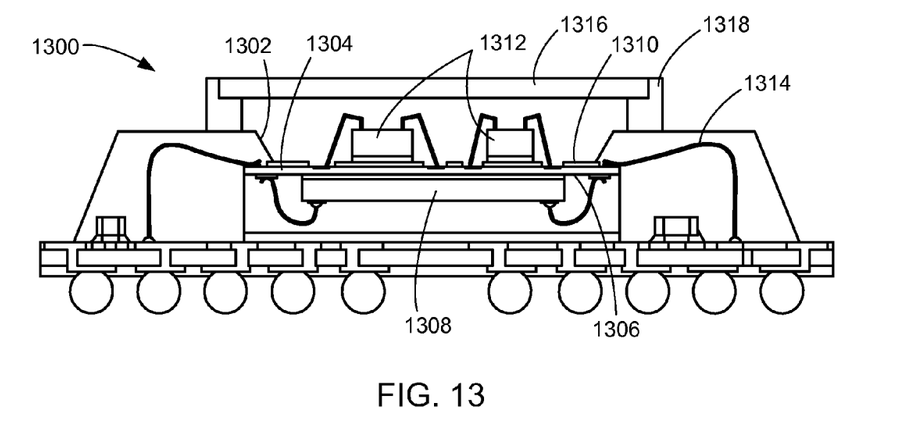
FIG. 13 is a cross-sectional view of an encapsulant cavity integrated circuit package system in yet another alternative embodiment of the present invention.

Referring now to FIG. 13, therein is shown a cross-sectional view of an encapsulant cavity integrated circuit package system 1300 in yet another alternative embodiment of the present invention. In a manner similar to the encapsulant cavity integrated circuit package system 100 of FIG. 1, the encapsulant cavity integrated circuit package system 1300 provides an encapsulant cavity 1302 with an interposer 1304, such as an LGA interposer. Similarly, a first surface 1306 of the interposer 1304 is attached to a first integrated circuit 1308 and a second surface 1310 of the interposer 1304 provides a surface for mounting components such as an optical sensor device 1312 as well as second electrical interconnects 1314.

The optical sensor device 1312 may surface mount to the second surface 1310 of the interposer 1304. The optical sensor device 1312 is electrically connected to the second surface 1310 of the interposer 1304 and encapsulated with an optical lid 1316, such as a transparent window, and a sealing dam 1318.

Figure 14:
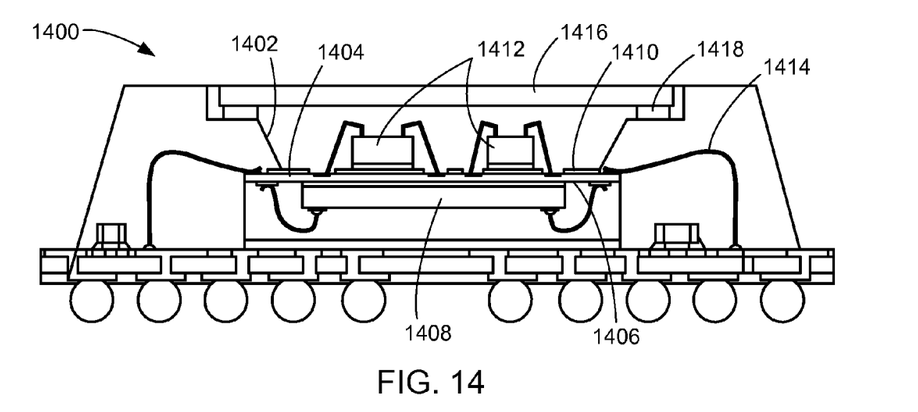
FIG. 14 is a cross-sectional view of an encapsulant cavity integrated circuit package system in yet another alternative embodiment of the present invention.

Referring now to FIG. 14, therein is shown a cross-sectional view of an encapsulant cavity integrated circuit package system 1400 in yet another alternative embodiment of the present invention. In a manner similar to the encapsulant cavity integrated circuit package system 100 of FIG. 1, the encapsulant cavity integrated circuit package system 1400 provides an encapsulant cavity 1402 with an interposer 1404, such as an LGA interposer. Similarly, a first surface 1406 of the interposer 1404 is attached to a first integrated circuit 1408 and a second surface 1410 of the interposer 1404 provides a surface for mounting components such as an optical sensor device 1412 as well as second electrical interconnects 1414.

The optical sensor device 1412 may surface mount to the second surface 1410 of the interposer 1404. The optical sensor device 1412 is electrically connected to the second surface 1410 of the interposer 1404 and encapsulated with an optical lid 1416, such as a transparent window, using an adhesive, such as a lid sealant. The encapsulant cavity 1402 is formed having a recess for the optical lid 1416 eliminating the need for the sealing dam 1318 of FIG. 13 (not shown). A lid sealant 1418, such as an adhesive, is applied between the optical lid 1416 and the encapsulant cavity 1402.

Figure 15:
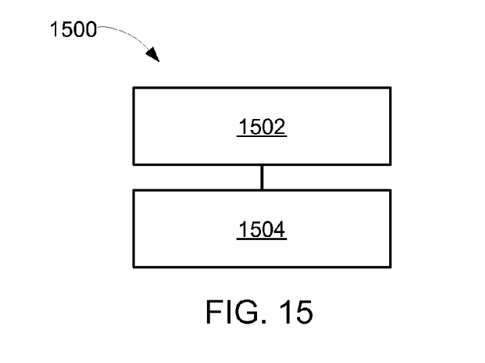
FIG. 15 is a flow chart of a system for an encapsulant cavity integrated circuit package system.

Referring now to FIG. 15 is a flow chart of a system 1500 for the encapsulant cavity integrated circuit package system 100. The system 1500 includes forming a first integrated circuit package having an encapsulant cavity with an interposer in a block 1502; and attaching a component on the interposer in the encapsulant cavity in a block 1504.

In greater detail, a method to fabricate the encapsulant cavity integrated circuit package system 100, in an embodiment of the present invention, is performed as follows:

1. Mounting the first integrated circuit 108 on the first surface 106 of the interposer 104. (FIG. 1)
2. Molding the first encapsulant 116 over the first integrated circuit 108 forming the first integrated circuit package 118. (FIG. 1)
3. Mounting the first integrated circuit package 118 over the substrate 120. (FIG. 1)
4. Molding the second encapsulant 124 over the first integrated circuit package 118 and the substrate 120 forming the encapsulant cavity 102 having the second surface 110 of the interposer 104 substantially exposed. (FIG. 1)
5. Mounting a component on the second surface 110 of the interposer 104 in the encapsulant cavity 102. (FIG. 1)

It has been discovered that the present invention thus has numerous aspects.

An aspect is that the present invention allows the top package to be of a smaller size. The interposer provides interconnection of a top package without the need for large dimensions to provide for overlapping the bottom integrated circuit. Enabling a smaller top package provides improved signal integrity as well as significant area and space savings.

It has been discovered that the disclosed structure allows the top known good die to be attached in many forms, such as direct chip attach, chip on board, flip chip, area array packages, leaded packages, or leadless packages. The interposer provides a flexible interface for compatibility to several different or multiple package connections.

It has also been discovered that the disclosed structure provides for the integration of integrated circuits of many types, such as passive devices, integrated circuits, integrated circuits with integrated passives, or optical sensors. The encapsulant cavity combined with the interposer provides a compatible packaging system for several different component types.

Yet another discovery of the disclosed structure is that the disclosed structure provides for a package on package (PoP). The encapsulant cavity and interposer are compatible with both components and other packages. Other packages may be mounted on the first integrated circuit package with the encapsulant cavity and the interposer.

Yet another discovery of the disclosed structure provides for a system in package (SiP). By providing for several attachment types and many device or component types, components of a system can be combined within the disclosed structure. The smaller size, flexibility and compatibility provide a broad range of system applications.

These and other valuable aspects of the present invention consequently further the state of the technology to at least the next level.

Thus, it has been discovered that the encapsulant cavity integrated circuit package system method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method for fabricating an encapsulant cavity integrated circuit package system comprising:
    mounting a first integrated circuit on a first surface of an interposer;
    molding a first encapsulant over the first integrated circuit forming a first integrated circuit package;
    mounting the first integrated circuit package with an inverted bottom terminal over a substrate;
    molding a second encapsulant over the first integrated circuit package with the inverted bottom terminal and the substrate forming an encapsulant cavity having a second surface of the interposer substantially exposed; and
    mounting a component on the second surface of the interposer in the encapsulant cavity.

2. The method as claimed in claim 1 wherein mounting the component comprises mounting passive devices on the second surface of the interposer in the encapsulant cavity.

3. The method as claimed in claim 1 wherein mounting the component comprises attaching a leaded package on the second surface of the interposer in the encapsulant cavity.

4. The method as claimed in claim 1 wherein mounting the component comprises attaching a leadless package on the second surface of the interposer in the encapsulant cavity.

5. The method as claimed in claim 1 wherein mounting the component comprises:
    mounting an optical sensor device on the second surface of the interposer in the encapsulant cavity; and
    attaching an optical lid over the optical sensor device and the encapsulant cavity.

6. An encapsulant cavity integrated circuit package system comprising:
    a first integrated circuit package includes a first integrated circuit on a first surface of an interposer with an inverted bottom terminal; a first encapsulant over the first integrated circuit forming the first integrated circuit package; the first integrated circuit package with the inverted bottom terminal over a substrate; a second encapsulant over the first integrated circuit package with the inverted bottom terminal and the substrate forming an encapsulant cavity having a second surface of the interposer substantially exposed;
    a component on the interposer in the encapsulant cavity; and the component is on the second surface of the interposer in the encapsulant cavity.

7. The system as claimed in claim 6 wherein the component comprises system device packages having surface-mount package technology.

8. The system as claimed in claim 6 wherein the component comprises system devices having chip-scale package technology.

9. The system as claimed in claim 6 wherein the component comprises passive devices on the second surface of the interposer in the encapsulant cavity.

10. The system as claimed in claim 6 wherein the component comprises a leaded package on the second surface of the interposer in the encapsulant cavity.

11. The system as claimed in claim 6 wherein the component comprises a leadless package on the second surface of the interposer in the encapsulant cavity.

12. The system as claimed in claim 9 wherein the component comprises:
    an optical sensor device on the second surface of the interposer in the encapsulant cavity; and
    an optical lid over the optical sensor and the encapsulant cavity.

* * * * *

UNITED STATES PATENT AND TRADEMARK OFFICE
CERTIFICATE OF CORRECTION

| | | |
|---|---|---|
| PATENT NO. | : 8,021,924 B2 | Page 1 of 1 |
| APPLICATION NO. | : 12/892907 | |
| DATED | : September 20, 2011 | |
| INVENTOR(S) | : Shim et al. | |

It is certified that error appears in the above-identified patent and that said Letters Patent is hereby corrected as shown below:

Column 10:
claim 12, line 37, delete "The system as claimed in claim 9 wherein" and insert therefor --The system as claimed in claim 6 wherein--

Signed and Sealed this
Twelfth Day of June, 2012

David J. Kappos
*Director of the United States Patent and Trademark Office*